(12) United States Patent
Hamm (10) Patent No.: US 9,105,871 B2
(45) Date of Patent: Aug. 11, 2015

(54) METHOD OF MANUFACTURING AN OLED DISPLAY DEVICE, THE RESULTING OLED DISPLAY DEVICE AND A TIMEPIECE COMPRISING THE SAME

(71) Applicant: EM Microelectronic- Marin SA, Marin (CH)

(72) Inventor: Alain Hamm, Lignieres (CH)

(73) Assignee: EM Microelectronic-Marin S.A., Marin (CH)

(*) Notice: Subject to any disclaimer, the term of this patent is extended or adjusted under 35 U.S.C. 154(b) by 92 days.

(21) Appl. No.: 13/942,966

(22) Filed: Jul. 16, 2013

(65) Prior Publication Data

US 2014/0133282 A1   May 15, 2014

(30) Foreign Application Priority Data

Nov. 9, 2012  (EP) .................................... 12192033

(51) Int. Cl.

| H01J 1/62 | (2006.01) |
| H01L 51/52 | (2006.01) |
| H01L 51/56 | (2006.01) |
| H01L 27/32 | (2006.01) |
| G04G 9/00 | (2006.01) |
| G04G 17/04 | (2006.01) |

(52) U.S. Cl.
CPC .............. *H01L 51/525* (2013.01); *G04G 9/00* (2013.01); *G04G 17/045* (2013.01); *H01L 27/3283* (2013.01); *H01L 51/56* (2013.01)

(58) Field of Classification Search
CPC .............................. H01L 51/525; H01L 51/56
USPC .................................. 313/506, 498, 504, 512
See application file for complete search history.

(56) References Cited

U.S. PATENT DOCUMENTS

| 4,488,818 A | 12/1984 | Saurer et al. |
| 2005/0242719 A1 | 11/2005 | Park |
| 2007/0228936 A1 | 10/2007 | Kim |
| 2007/0274161 A1 | 11/2007 | Rydgren |
| 2009/0243480 A1 | 10/2009 | Park |

FOREIGN PATENT DOCUMENTS

| EP | 0 078 237 A1 | 5/1983 |
| EP | 1 594 177 A2 | 11/2005 |
| JP | 4784809 B2 | 7/2011 |
| WO | WO 00/28387 | 5/2000 |
| WO | WO 2007/134643 A1 | 11/2007 |

OTHER PUBLICATIONS

European Search report issued Mar. 18, 2013 in EP 12192033, filed Nov. 9, 2012 ( with English Translation).

*Primary Examiner* — Vip Patel
(74) *Attorney, Agent, or Firm* — Oblon, McClelland, Maier & Neustadt, L.L.P.

(57) ABSTRACT

Organic light emitting diode display device including a substrate covered by a cover which has a plane surface delimited along the external perimeter thereof. The plane surface of the cover is provided with a protuberance. The substrate is provided with a stack of layers, the stack of layers including at least the following layers in succession in the following order starting from the substrate: at least one anode; an insulating layer; a spacer layer which has a first exclusion area in a first area; an active hole injection layer, an active hole transport layer and an active electron transport layer; a cathode layer which has a second exclusion area. The protuberance of the cover is joined to the layer with which the protuberance is in contact, a hole, whose diameter is smaller than the geometrical dimensions of the protuberance, being made in the protuberance and through the substrate.

10 Claims, 6 Drawing Sheets

METHOD OF MANUFACTURING AN OLED DISPLAY DEVICE, THE RESULTING OLED DISPLAY DEVICE AND A TIMEPIECE COMPRISING THE SAME

This application claims priority from European Patent Application No. 12192033.4 filed Sep. 11, 2012, the entire disclosure of which is incorporated herein by reference.

FIELD OF THE INVENTION

The present invention concerns a method of manufacturing a display device using organic light emitting diodes known as OLEDs. The present invention also concerns a display device with light emitting diodes obtained by implementing this method, in addition to a timepiece comprising a display device of this type.

BACKGROUND OF THE INVENTION

The present invention concerns OLED display devices. More specifically, the present invention concerns display devices known as passive matrix organic light emitting diodes or PMOLEDs. In PMOLED display devices, lighting is controlled by means of anodes and cathodes which are disposed in strips perpendicular to each other and powered separately. Although less energy efficient than active matrix light emitting diodes, also known as AMOLEDs, PMOLED display devices are less complex to make than AMOLED display devices and consequently were the first to be mass marketed.

Compared to other types of display devices such as liquid crystal cells, OLED display devices have very interesting advantages such as a very rapid response time, improved colour rendering, better contrast or even less directive emissivity, thus offering a broader angle of vision. Compared to liquid crystal display devices, another decisive advantage of OLED display devices is that they do not require backlighting. However, one drawback of OLED display devices is their sensitivity to air and moisture.

Very succinctly summarised, a PMOLED display device includes a base substrate, for example made of glass, on which anodes are structured in parallel strips. These anodes are made of a transparent, electrically conductive material such as indium tin oxide also known as ITO. After the indium tin oxide layer has been deposited on the glass substrate and the anodes have been structured, there is deposited in succession an insulating layer, whose purpose is to separate the line electrodes and column electrodes from each other, and a separation layer whose role is to create a space between the anodes and the cathodes to be deposited. The actual active layers, of which there are three, are then deposited: a hole injection layer, a hole transport layer and an electron transport layer. Finally, a layer of conductive material such as aluminium is deposited, in which the cathodes are structured. The resulting structure is covered with a cover which is bonded onto the edge of the base substrate. A moisture trap may be arranged in the volume left vacant by the cover.

As mentioned above, OLED display devices have a certain number of very interesting advantages for use, for example, in portable electronic objects, such as wristwatches. However, in the particular field of horology, those skilled in the art have been confronted by a problem, which, to the Applicant's knowledge, has not yet been resolved. This problem is connected to the combined use, in a timepiece, of a digital OLED display device and an analogue display device which conventionally includes a set of hour and minute hands. Indeed, in that case, the OLED display device is on the watch dial and the hour and minute hands move above the OLED display device. The hour and minute hands are carried by a set of concentric arbours which must necessarily pass through the OLED display device. However, since the active layers and the cathode layer of an OLED display device are very sensitive to air and moisture, it is not possible to envisage piercing the OLED display device for the arbours carrying the hour and minute hands to pass therethrough, since this would place the moisture-sensitive layers of the OLED display device in direct contact with the atmosphere.

SUMMARY OF THE INVENTION

Consequently, it is an object of the present invention to provide an OLED display device in which a hole may be made for the arbours carrying the hour and minute hands to pass through.

The present invention therefore concerns a light emitting diode display device, said display device including a substrate covered by a cover which has a plane surface delimited along the external perimeter thereof by an edge, via which the cover is secured to the substrate, the plane surface of the cover being provided with an outgrowth or protuberance which extends in the direction of the substrate, the substrate being provided with a stack of layers, said stack of layers comprising at least the following layers which succeed each other in the following order starting from the substrate:

at least one anode layer;
an insulating coating;
a spacer layer which has a first exclusion area in a first area which is located plumb with the protuberance;
an active hole injection layer;
an active hole transport layer;
an active electron transport layer;
a cathode which has a second exclusion area in a second area which is located plumb with the protuberance;
the protuberance of the cover being joined to the layer with which the protuberance is in contact, a hole, whose diameter is smaller than the geometrical dimensions of the protuberance, being made in the protuberance, and said hole also passing through the substrate.

As a result of these features, the present invention provides an OLED type display device which can be completely traversed by a hole through which, in the preferred example embodiment of the invention, a set of concentric arbours respectively carrying an hour hand and a minute hand are intended to pass. In fact, the protuberance of the cover, in which the hole is made for the hour and minute hand arbours to pass through, is totally sealed against moisture and oxygen, so that the active layers and the cathode layer of the OLED display device according to the invention are not liable to be damaged. To achieve this result, the present invention teaches providing an exclusion area in the spacer layer and in the cathode layer plumb with the protuberance of the cover. In other words, at the location of these exclusion areas, the materials used to deposit the spacer layer and the cathode layer are omitted. Indeed, after performing several tests, it was realised that if the spacer layer and the cathode layer remain at the place where the protuberance of the cover comes into contact with the active layers of the OLED display device, these cathode and spacer layers experience delamination when the hole is made in the protuberance of the cover, which results in the irreversible destruction of the OLED display device. Finally, it was noted that the quality of the bond between the protuberance and the substrate is much higher when the cathode and spacer layers are not present.

The present invention also concerns a method of manufacturing an OLED display device, said method including the steps consisting in:

taking a substrate and a cover which has a plane surface delimited along the external periphery thereof by an edge, via which the cover is intended to be secured to the substrate, the plane surface of the cover being provided with a protuberance, which extends in the direction of the substrate;

depositing in succession on the substrate at least one anode layer and an insulating coating;

then depositing a spacer layer in which a first exclusion area is arranged in a first area which will be located plumb with the protuberance of the cover once the cover is secured to the substrate;

depositing an active hole injection layer, an active hole transport layer and an active electron transport layer in that order;

depositing a cathode layer in which a second exclusion area is arranged in a second area which will be plumb with the protuberance of the cover once the cover is secured to the substrate, and joining the cover to the substrate, then making a hole, whose diameter is smaller than the geometrical dimensions of the protuberance, in the protuberance of the cover and in the substrate.

According to a complementary feature of the method of the invention, the spacer layer, respectively the cathode layer, is deposited in two successive steps by means of a first mask, in which there is arranged a first aperture corresponding to a first portion of the spacer layer, respectively of the cathode layer, to be deposited, said first mask at least partially concealing an area of the substrate so as to form, in the spacer layer, respectively in the cathode layer, an exclusion area, which will be plumb with the protuberance once the cover is secured to the substrate; and by means of a second mask, which has a second aperture corresponding to a second portion of the spacer layer, respectively of the cathode layer, to be deposited, said second mask concealing if necessary the remainder of the area of the substrate, so as to form in the spacer layer, respectively in the cathode layer, the rest of the exclusion area which will be located plumb with the protuberance once the cover is secured to the substrate, the second aperture of the second mask being complementary to the first aperture of the first mask so that the combination of the first aperture and the second aperture corresponds to the desired spacer layer, respectively the cathode layer.

The present invention also concerns a timepiece comprising a light emitting diode display device in which a hole is made for an hour hand arbour and a minute hand arbour to pass through.

BRIEF DESCRIPTION OF THE DRAWINGS

Other features and advantages of the present invention will appear more clearly from the following detailed description of one embodiment of an OLED display device according to the invention, this example being given solely by way of non-limiting illustration with reference to the annexed drawing, in which.

DETAILED DESCRIPTION OF THE PREFERRED EMBODIMENTS

The present invention proceeds from the general inventive idea which consists in providing an organic light emitting diode display device in which it is possible to make a hole for the arbours of hour and minute hands, for example, to pass through. It is known that it is impossible to make a hole straight into an OLED display device since this would place the active layers of the OLED display device in contact with the atmosphere and destroy them. To overcome this problem, the present invention teaches arranging an exclusion area in the spacer layer and in the cathode layer deposited on the substrate of the organic light emitting display device. In other words, at the location of these exclusion areas, the materials used to deposit the spacer layer and the cathode layer are omitted. The exclusion areas are located plumb with an protuberance provided in the bottom face of a cover which will cover the OLED display device at the end of manufacture. The hole for the arbours of the hour and minute hands is made in the protuberance and in the cover. This operation is made possible by the absence of the spacer layer and the cathode layer at the place where the protuberance comes into contact with the substrate. It was in fact realised that when the spacer layer and the cathode layer are present, these layers are subject to delamination when the hole is made in the protuberance of the cover. Further, the adhesion of the protuberance to the substrate is much better when the spacer and cathode layers are omitted. Having reached the conclusion that the spacer and cathode layers had to be omitted from the protuberance area, a method had to be found for depositing these layers in the desired manner. For this purpose, the present invention teaches depositing the spacer layer, respectively the cathode layer, in two successive steps, using two distinct masks, the first of which comprises a first aperture corresponding to a first portion of the spacer layer, respectively of the cathode layer, to be deposited, said first mask concealing all or part of the area of the substrate where it is desired to create the exclusion area; and the second of which comprises a second aperture which is the complement of the first aperture arranged in the first mask and which, if necessary, conceals the rest of the area of the substrate where it is desired to create the exclusion area. Finally, the invention concerns a portable object, such as a timepiece, comprising a light emitting diode display device in which a hole is made for an hour hand arbour and a minute hand arbour to pass through.

The various steps of the method for making a light emitting diode display device or OLED display device according to the invention are described below.

Figure 1A:
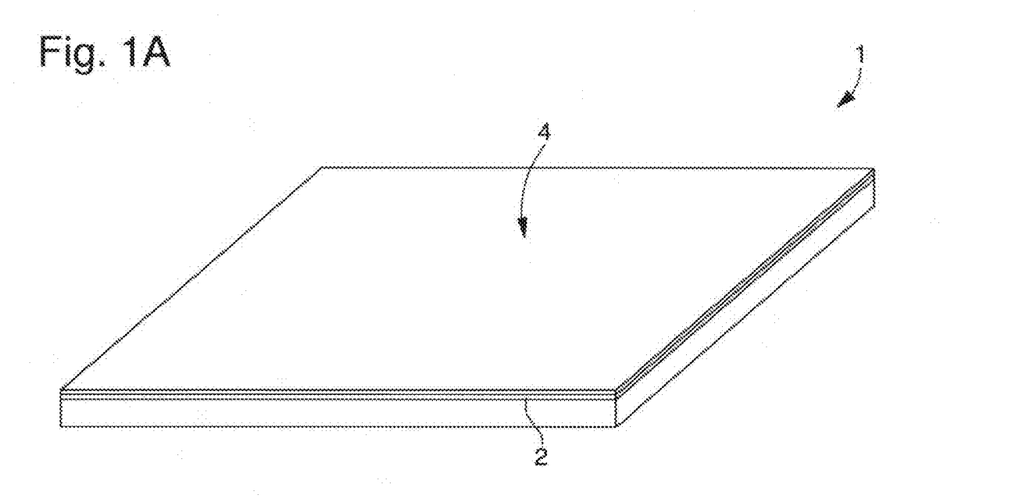
FIG. 1A is a perspective view of a glass substrate on which a conductive indium tin oxide layer and a chromium layer have been deposited in succession.

FIG. 1A is a perspective view of a substrate 1, for example made of glass, on the surface of which a first conductive layer 2 and a second conductive layer 4 have been deposited in succession. The first conductive layer 2 is for example made of indium tin oxide, better known as ITO, and the second conductive layer 4 is for example made of chromium.

Figure 1B:
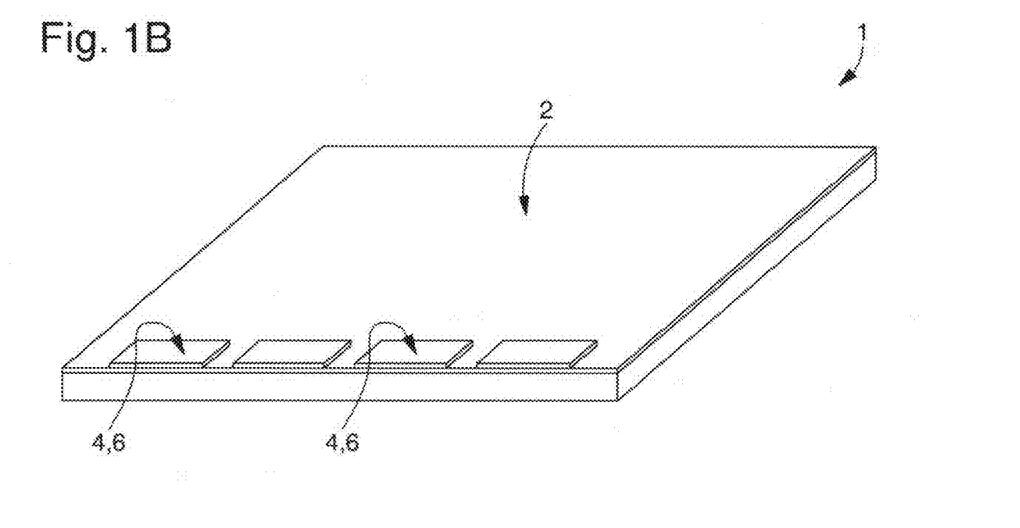
FIG. 1B is a similar view to that of FIG. 1A, showing the step of structuring the chromium layer.

In FIG. 1B, the second conductive layer 4 has been practically removed from the entire surface by photolithography and chemical etching. Chromium remains only on contact pads 6 where the presence of this material improves electrical conduction.

Figure 1C:
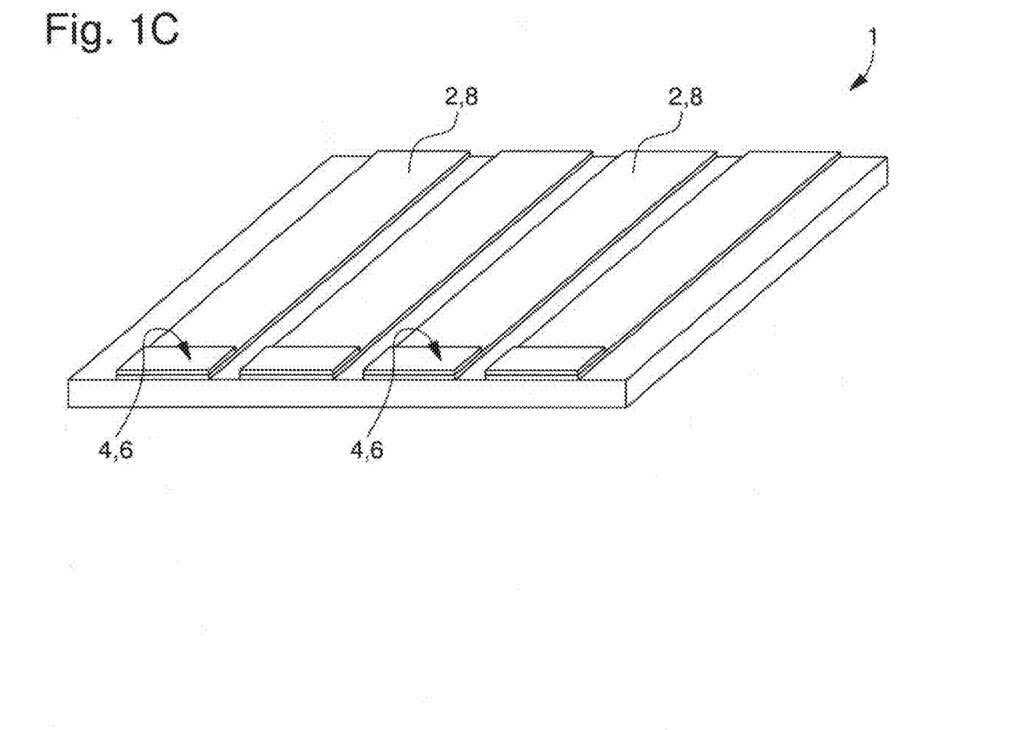
FIG. 1C illustrates the step of structuring the conductive indium tin oxide layer.

FIG. 1C illustrates the step of structuring anodes 8. These anodes 8 take the form of parallel strips and are obtained by photolithography and chemical etching of the first conductive ITO layer 2.

Figure 1D:
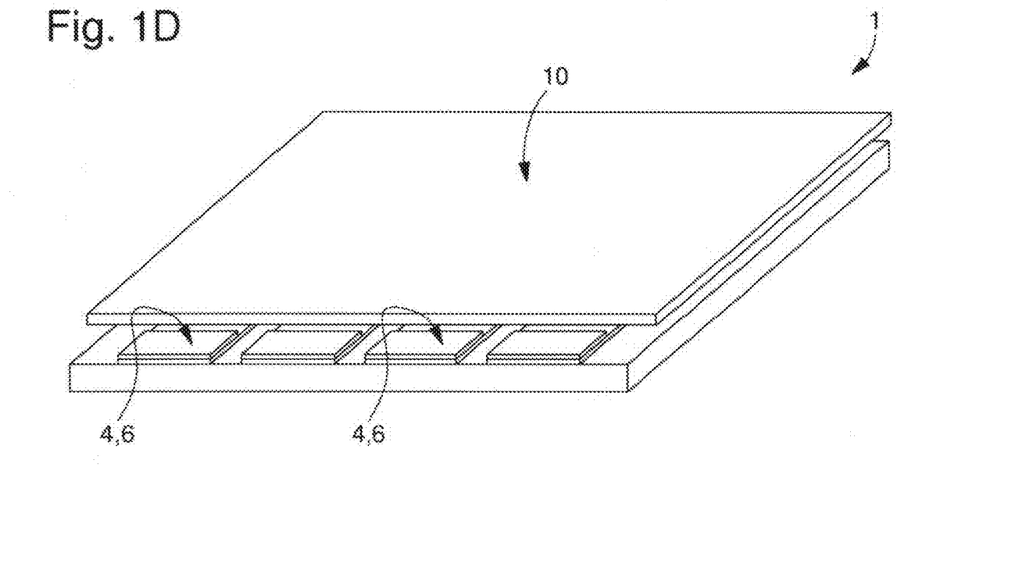
FIG. 1D illustrates the deposition of an insulating layer.
Figure 1E:
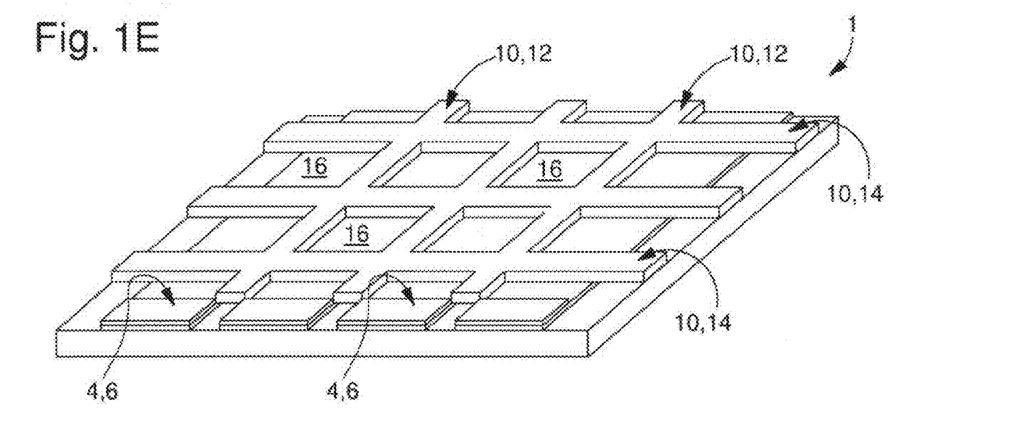
FIG. 1E illustrates the structuring of the insulating layer so as to delimit the matrix display pixels.

FIG. 1D illustrates the step of depositing an insulating layer 10 over ITO anodes 8. As seen upon examining FIG. 1E, insulating layer 10 is structured in lines 12 and columns 14 so as to delimit conductive areas 16 which will form the display pixels of the OLED display device of the invention.

Figure 1F:
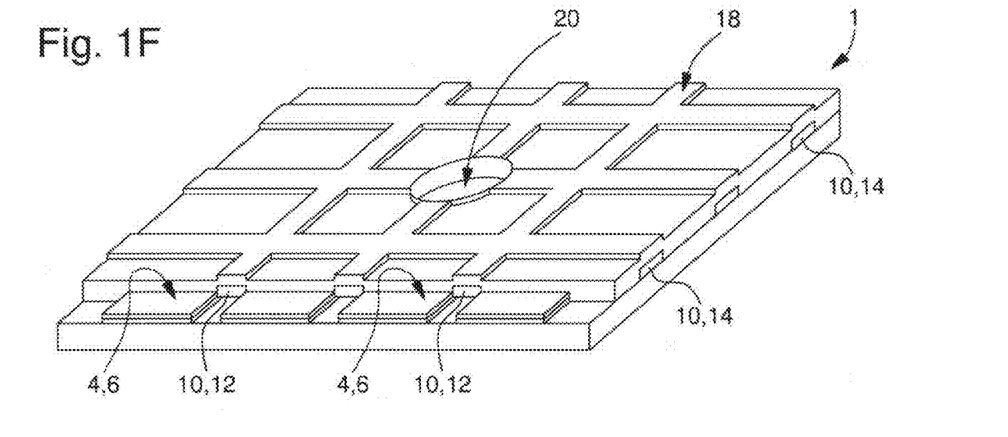
FIG. 1F illustrates the deposition of the separation layer.

In FIG. 1F, a layer of spacer material 18 is deposited in uniform thickness over substrate 1. The function of this layer of spacer material 18 is to separate anodes 8 from the cathode which will be structured in a subsequent step of the method. It is seen that, substantially at the centre of substrate 1, the spacer material has not been deposited so as to create an exclusion area 20 located plumb with an outgrowth or protuberance provided in the bottom face of a cover which, as will be seen in detail below, will cover the OLED display device of the invention at the end of manufacture.

Figure 1G:
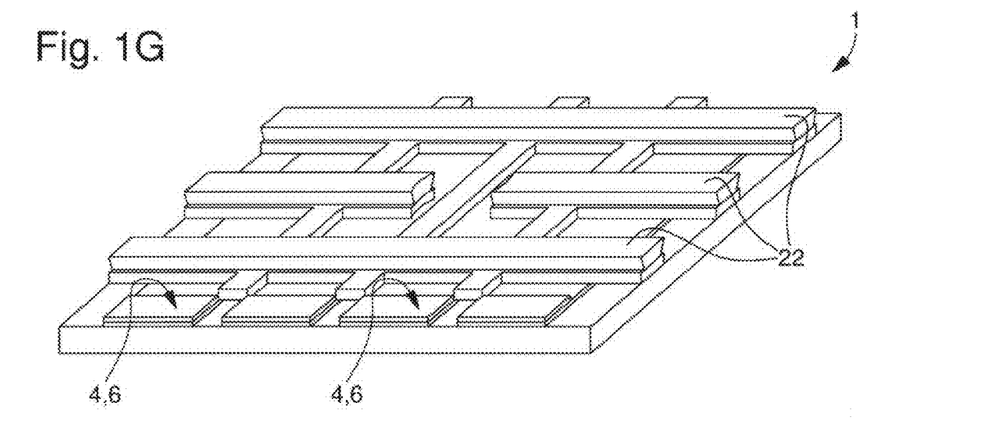
FIG. 1G illustrates the structuring of the separation layer.

In FIG. 1G, the spacer layer has been structured to form spacers 22, which, in the example shown in the drawing, extend parallel to each other in a generally perpendicular direction to anodes 8.

Figures 1H, 1I, 1J:
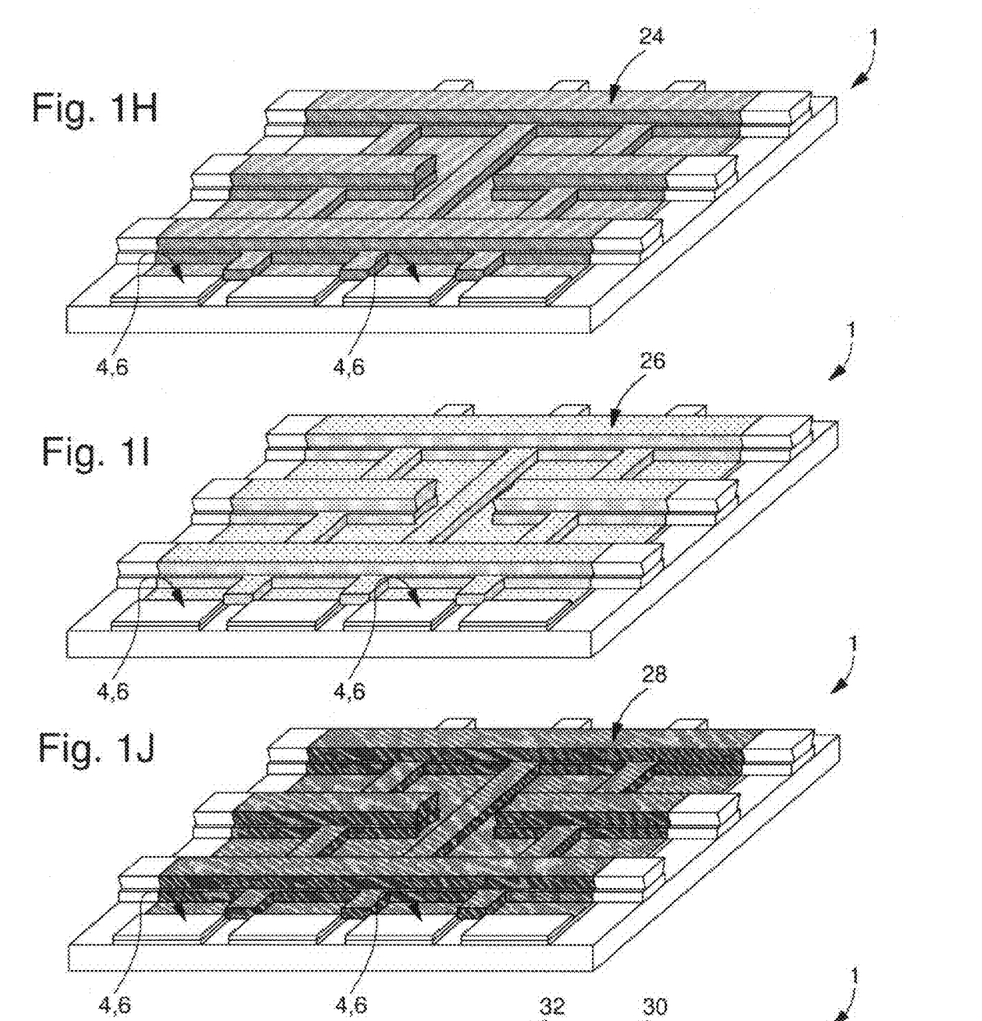
FIGS. 1H, 1I and 1J respectively illustrate the deposition of the active hole injection, hole transport and electron transport layers.

In FIGS. 1H, 1I and 1J, the active layers of the OLED display device of the invention are deposited one after the other, namely a hole injection layer 24, a hole transport layer 26 and an electron transport layer 28. These three layers 24, 26 and 28 are deposited in a non-selective manner over the entire surface of substrate 1.

Figure 1K:
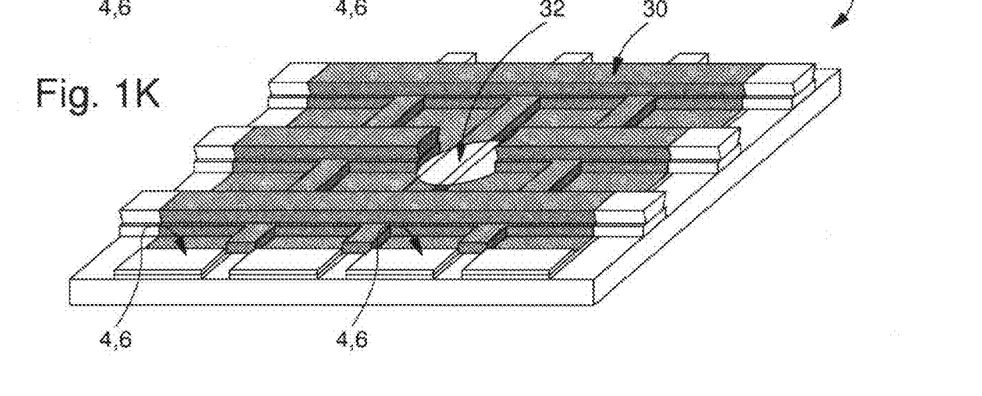
FIG. 1K illustrates the deposition of the cathode layer.

Finally, as shown in FIG. 1K, a layer 30 which will form the cathode of the OLED display device of the invention, is deposited on substrate 1. This cathode layer 30 is obtained by evaporating an electrically conductive material, such as, in a non limiting manner, aluminium. It may also be a mixture of aluminium and calcium or a barium and silver alloy. It is seen that, substantially at the centre of substrate 1, cathode material 30 has not been deposited so as to create an exclusion area 32 located plumb with an outgrowth or protuberance 36 provided in the bottom face of a cover which, as will be seen in detail below, will cover the OLED display device of the invention at the end of manufacture.

Figure 2:
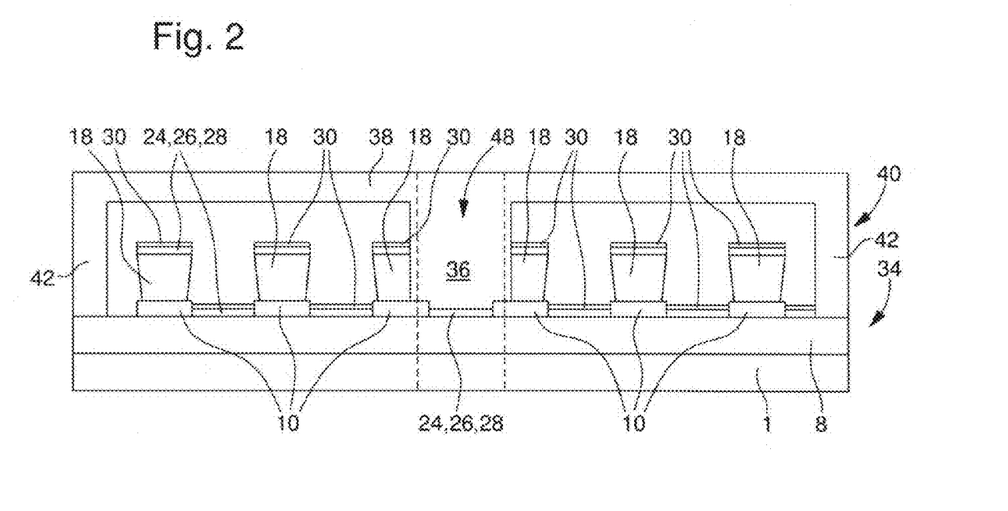
FIG. 2 is a cross-section of an organic light emitting diode display device according to the invention.

Reference will now be made to FIG. 2 which is a cross-section of an organic light emitting diode display device according to the invention. Designed as a whole by the general reference numeral 34, the OLED display device of the invention includes substrate 1 over which the indium tin oxide or ITO anode layer 8, insulating layer 10 and spacer layer 18 have been deposited in succession. According to the invention, this layer of spacer material 18 is omitted at the place where exclusion area 20 is located. It will be recalled that exclusion area 20 is located plumb with an outgrowth or protuberance 36, which extends in the direction of substrate 1 and which is arranged in the plane surface 38 of a cover 40 which covers OLED display device 34 of the invention at the end of manufacture.

The method of manufacturing OLED display device 34 of the invention continues with the non-selective deposition of the active layers of the OLED display device of the invention, namely a hole injection layer 24, a hole transport layer 26 and an electron transport layer 28. The manufacturing method ends with the deposition of cathode layer 30. According to the invention, this cathode layer 30 is omitted from the place where exclusion area 32 is located. It will be recalled that exclusion area 32 is located plumb with protuberance 36 which is arranged in the plane surface 38 of cover 40 which will cover OLED display device 34 of the invention at the end of manufacture.

Finally, OLED display device 34 is hermetically sealed by means of cover 40. Cover 40 has an edge 42, along the external periphery of the plane surface 38 thereof, via which cover 40 is secured, by means of an adhesive film 44, to substrate 1. Protuberance 36, arranged in plane surface 38 of cover 40, extends in the direction of substrate 1 in the area where exclusion areas 20 and 32 are arranged in spacer layer 18 and cathode layer 30. Consequently, protuberance 36 is in virtually direct contact with substrate 1, only separated therefrom by anode layer 8 and by active layers 24, 26 and 28, which are very thin. A thin adhesive film 46 enables protuberance 36 to be bonded to substrate 1.

According to the invention, a hole 48, whose diameter is smaller than the geometrical dimensions of protuberance 36, is made in protuberance 36. Hole 48 also traverses substrate 1. As a result of this feature, the present invention provides an OLED display device in which a through hole is made without placing the active layers and the cathode layer in contact with moisture and oxygen.

Figure 3:
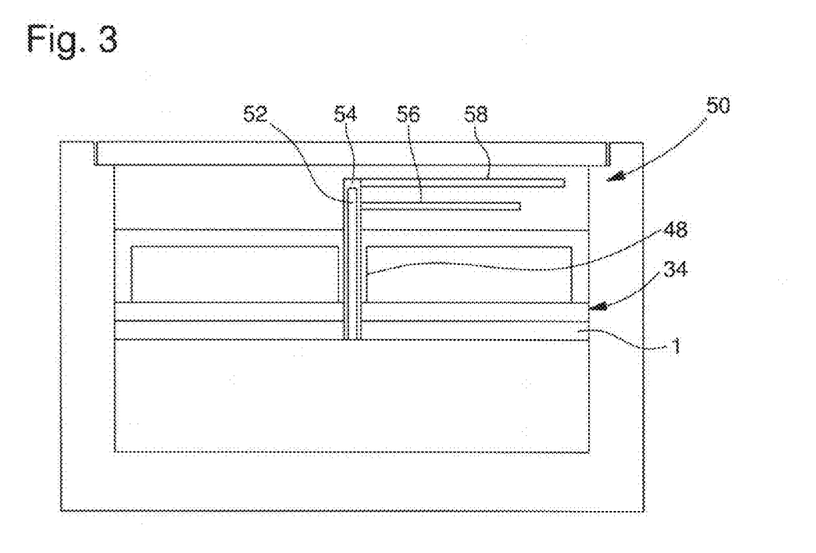
FIG. 3 is a schematic view of a wristwatch fitted with an OLED display device according to the invention.

FIG. 3 is a schematic diagram of a wristwatch fitted with an OLED display device 34 according to the invention. In the example shown, OLED display device 34 acts as the dial of watch 50 and a hole 48, which passes through OLED display device 34 and substrate 1, is advantageously used for the passage of two concentric arbours 52 and 54 respectively carrying an hour hand 56 and a minute hand 58.

Figure 4A:
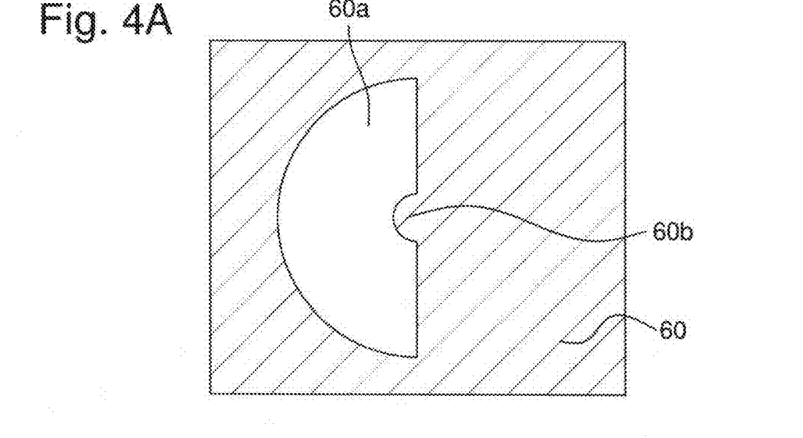
FIGS. 4A, 4B and 4C are top views of the first and second masks used for the vapour deposition of the spacer layer and of the cathode layer.
Figure 4B:
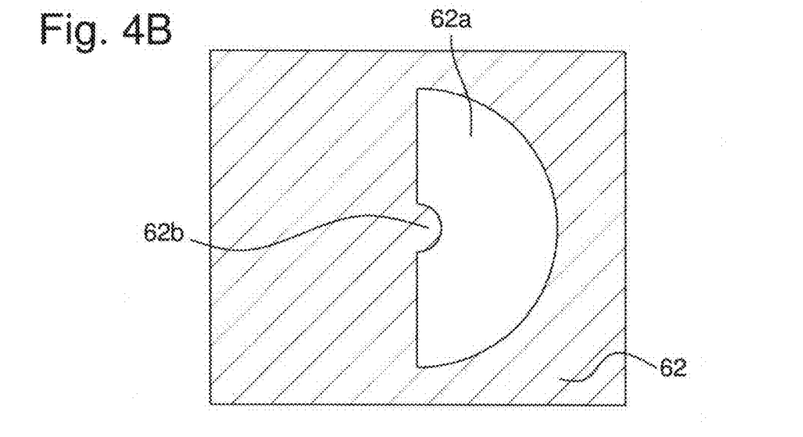
Figure 4C:
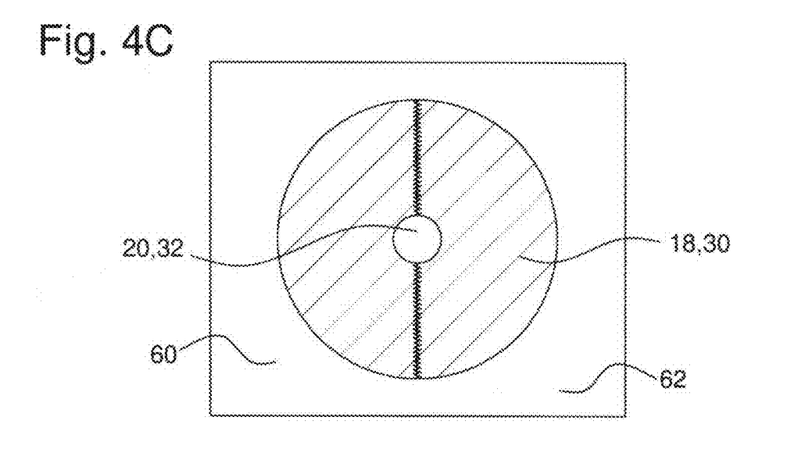

FIGS. 4A and 4B are top views of the first and second masks 60 and 62 used for the vapour deposition of spacer layer 18 and cathode layer 30. According to the invention, spacer layer 18 and cathode layer 30 are deposited in two successive steps using first and second masks 60 and 62. Therefore, first mask 60 comprises a first aperture 60a corresponding to a first portion of the spacer layer 18, respectively of the cathode layer 30, to be deposited. First mask 60 also comprises a first cover portion 60b for concealing all or part of the area of substrate 1 where it is desired to create exclusion areas 20, 32. Subsequently, the second mask 62 comprises a second aperture 62a which is the complement of the first aperture 60a arranged in the first mask 60 and which, if necessary, includes a second cover portion 62b which is the complement of first cover portion 60b and which conceals the rest of the area of substrate 1 where it is desired to create exclusion areas 20 and 32. Finally, FIG. 4C shows that the joining of the first and second masks 60 and 62 enables the external contour of spacer layer 18 and of cathode layer 30 to be delimited with exclusion areas 20 and 32 at the centre of said two layers 18 and 30. It will be clear that FIG. 4C is not an illustration of a step of the manufacturing method of the OLED display device of the invention, but it merely demonstrates that, placed end-to-end, the two masks 60 and 62 have perfectly complementary shapes which delimit the contour of spacer layer 18 and cathode layer 30 with the exclusion area at the centre.

It goes without saying that this invention is not limited to the embodiment that has just been described and that various simple modifications and variants can be envisaged by those skilled in the art without departing from the scope of the invention as defined by the annexed claims. It will be clear, in particular, that although it was mentioned above that the protuberance provided in the bottom face of the cover is located substantially at the centre of the OLED display device of the invention, it goes without saying that this protuberance may be located at any location on the bottom face of the cover.

What is claimed is:

1. An organic light emitting diode display device, comprising:
    a substrate covered by a cover which has a plane surface delimited along the external perimeter thereof by an edge, via which the cover is secured to the substrate,
    wherein the plane surface of the cover is provided with a protuberance which extends in the direction of the substrate,
    wherein the substrate is provided with a stack of layers including at least the following layers which succeed each other in the following order starting from the substrate:
        at least one anode;
        an insulating layer;
        a spacer layer which has a first exclusion area in which material used to form the spacer layer is omitted;
        an active hole injection layer;
        an active hole transport layer;
        an active electron transport layer; and
        a cathode layer which has a second exclusion area in which material used to form the cathode layer is omitted,
    wherein the protuberance of the cover extends through the first exclusion area and the second exclusion area and is joined to the layer with which the protuberance is in contact, and
    wherein a hole, whose diameter is smaller than the geometrical dimensions of the protuberance, passes through the protuberance and the substrate.

2. The organic light emitting diode display device according to claim 1, wherein the at least one anode includes multiple anodes arranged in parallel strips.

3. The organic light emitting diode display device according to claim 1, wherein the first exclusion area is a hole in the spacer layer.

4. The organic light emitting diode display device according to claim 3, wherein the first exclusion area is positioned at a center of the substrate.

5. The organic light emitting diode display device according to claim 1, wherein the second exclusion area is a hole in the cathode layer.

6. The organic light emitting diode display device according to claim 5, wherein the second exclusion area is positioned at a center of the substrate.

7. The organic light emitting diode display device according to claim 1, wherein the first exclusion area and the second exclusion area are positioned at a center of the substrate.

8. The organic light emitting diode display device according to claim 1, wherein the cover hermetically seals the organic light emitting diode display device.

9. The organic light emitting diode display device according to claim 1, wherein the layer with which the protuberance is in contact is the active hole injection layer, the active hole transport layer, or the active electron transport layer.

10. A timepiece, comprising:
    an organic light emitting diode display device including a substrate covered by a cover which has a plane surface delimited along the external perimeter thereof by an edge, via which the cover is secured to the substrate,
    wherein the plane surface of the cover is provided with a protuberance which extends in the direction of the substrate,
    wherein the substrate is provided with a stack of layers including at least the following layers which succeed each other in the following order starting from the substrate:
        at least one anode;
        an insulating layer;
        a spacer layer which has a first exclusion area in which material used to form the spacer layer is omitted;
        an active hole injection layer;
        an active hole transport layer;
        an active electron transport layer; and
        a cathode layer which has a second exclusion area in which material used to form the cathode layer is omitted,
    wherein the protuberance of the cover extends through the first exclusion area and the second exclusion area and is joined to the layer with which the protuberance is in contact,
    wherein a hole, whose diameter is smaller than the geometrical dimensions of the protuberance, passes through the protuberance and the substrate, and
    wherein an hour hand and an arbour of a minute hand pass through the hole.

* * * * *